United States Patent [19]
Wendell et al.

[11] Patent Number: 5,208,838
[45] Date of Patent: May 4, 1993

[54] CLOCK SIGNAL MULTIPLIER

[75] Inventors: Dennis L. Wendell; Charles Hochstedler; Dan Lunecki, all of Puyallup, Wash.; Terry L. Lyon, Roseville, Minn.

[73] Assignee: National Semiconductor Corporation, Santa Clara, Calif.

[21] Appl. No.: 502,207

[22] Filed: Mar. 30, 1990

[51] Int. Cl.⁵ ............................................... H04L 7/00
[52] U.S. Cl. ..................................... 375/106; 328/38.1
[58] Field of Search ................. 375/106; 328/15, 20, 328/38, 47, 48, 38; 307/271

[56] References Cited
U.S. PATENT DOCUMENTS

| | | | |
|---|---|---|---|
| 3,743,946 | 7/1973 | Gass et al. | 377/47 |
| 3,835,396 | 9/1974 | Demos et al. | 328/15 |
| 3,865,305 | 2/1975 | Sampey | 377/47 |
| 4,011,516 | 3/1977 | Heimbigner et al. | 328/14 |
| 4,353,030 | 10/1982 | Nakamura et al. | 328/38 |
| 4,876,702 | 10/1989 | Lesko | 375/120 |

Primary Examiner—Stephen Chin
Attorney, Agent, or Firm—Irving S. Rappaport; Robert C. Colwell; Richard L. Hughes

[57] ABSTRACT

A clock multiplier is selectable to provide either an unmultiplied input clock to the internal clock line or a multiplied clock signal, depending upon the state of a test mode input signal. By providing the circuitry on a integrated circuit chip, the chip can be driven at its normal operating frequency using lower-frequency test equipment. One multiplier device includes a plurality of series-connected one-shots.

18 Claims, 3 Drawing Sheets

CLOCK SIGNAL MULTIPLIER

BACKGROUND OF THE INVENTION

The present invention relates to a multiplier for converting a clock signal to a higher-frequency clock signal and in particular to a multiplier comprising a plurality of series-connected one-shots.

During design of integrated circuits and during quality control of integrated circuit production, it is common for circuit testing equipment to be connected to an integrated circuit for driving a circuit and observing the resultant output signals. Many modern integrated circuits are designed to operate at high clock signal frequencies such as 0.2 gigahertz (GHz) or more. Thus, it is desirable when testing such a chip to provide a high frequency clock signal. However, much commonly-available testing equipment has a maximum clock period of about 40 nsec., and thus is incapable of driving a chip at a high frequency clock signal. Although some specialty test equipment may be available for high frequency testing, the cost and availability of such specialty test equipment makes it impractical to use specialty test equipment for, e.g., quality control testing or field testing of installed equipment. The typically available test equipment provides a clock signal with a frequency of about 25 megahertz (MHz) or less.

Accordingly, there is a need for a system for testing integrated circuits at a high clock frequency, approaching the normal operating clock frequency for the circuit, without requiring expensive and not readily available high-frequency test equipment.

SUMMARY OF THE INVENTION

According to the present invention, circuitry is provided, for multiplying an input clock signal to provide a higher-frequency clock signal. The circuitry includes a selection device for determining whether to apply the input clock signal or the multiplied clock signal to the clock lines of the circuit. In this way, a chip can be installed and used in its normal environment by applying the input clock signal directly to the clock lines of the chip. However, when the chip undergoes testing, the input clock signal which will typically be a lower-frequency clock signal, can be multiplied by the multiplier device and the multiplied clock frequency, which will preferably be about equal to the ordinary operating frequency of the integrated circuit, can be applied to the integrated circuit clock lines for testing.

The present invention includes providing a multiplier which comprises a plurality of series-connected one-shots. In this configuration, when the input clock signal is applied to the multiplier, it activates the first of the one-shots which is typically a monostable, multi-vibrator. After a period of time (defining a pulse-width) the one-shot will output a signal which will activate the next in the plurality of series-connected one-shots. In this manner, each one-shot, in turn, will output a signal which is delayed from the previous one-shot signal by a pulse-width. The series of one-shots provide a cascade of signals for each input clock signal and in this way will multiply the single input clock signal to a plurality of clock signals. In order for the plurality of output clock signals to define a frequency which is an integral multiple of the input clock signal frequency, the one-shots preferably have an adjustable pulse-width which can be adjusted in response to monitoring the multiplier output. Preferably, the one-shots have a pulse-width which is adjustable in response to an analog signal. In one embodiment, an analog signal is provided which is proportional to the percentage of time the second clock signal is in a first state compared to the amount of time it is in a second state.

DETAILED DESCRIPTION OF THE PREFERRED EMBODIMENT

The present invention includes circuitry for multiplying a clock signal which is selectable to permit output of either the original clock signal or the multiplied signal. The circuitry for selectably multiplying the clock is preferably provided on the same chip as the internal clock line to which the multiplied clock signal is applied.

Figure 1:
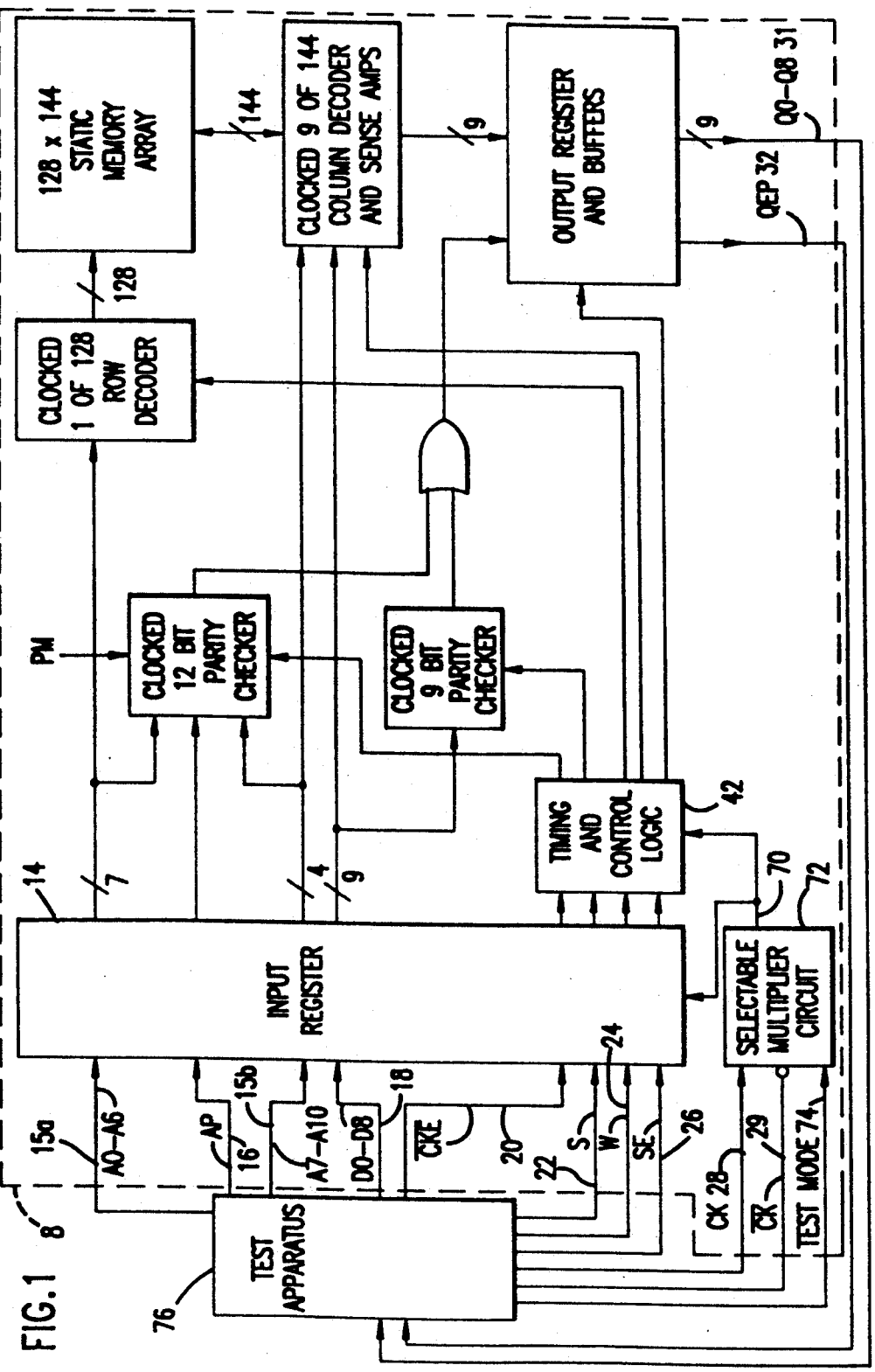
FIG. 1 is a block diagram of a static memory chip which includes a selectable clock multiplier according to the present invention.

FIG. 1 shows a block diagram of a static memory chip which is one preferred embodiment of the selectable clock signal multiplier.

The embodiment depicted in FIG. 1 shows a 2k×9 memory chip which includes a 128×144 static memory array 12. A memory chip such as that depicted can be used for a number of purposes including register files, writable control stores, cache RAM's, cache tag RAMs, and address translation look-aside buffers (TLBs). As will be apparent to those skilled in the art, the clock-multiplying scheme of the present invention can also be used in connection with other types of memories including other sizes of memories, dynamic memories, read only memories, as well as in connection with the memories used for other purposes such as main memory, buffers, and the like.

The embodiment depicted in FIG. 1 includes an input register 14 for receiving a number of input signals. These input signals include 11 address bits 15a, 15b, an address parity signal 16, nine data bits 18, a clock enable ($\overline{CKE}$) signal 20, a chip select ($\overline{S}$) signal 22, a write enable ($\overline{W}$) signal 24, and a scan enable (SE) input 26. In all cases, an overbar indicates the complement of the signal.

In the depicted embodiment, 11 address bits A0–A10 are provided on two address busses 15a, 15b. The 11 address bits A0–A10 provide the capability to address 2k 9-bit words of memory. As will be apparent, other address sizes can also be used in connection with another memory configuration. The address parity (AP) input 16 is set or reset, e.g. by the processor (not shown) to ensure that the combination of the address bits A0–A10 and the address parity bit AP will have the desired parity. The clock enable input 20 when in its active state (low) permits the memory device 10 to function normally When $\overline{CKE}$ 20 is inactive, the memory device 10 does nothing on the rising clock edges, thereby providing a means for controlling the clock input to the device.

The chip select input 22 can be used to inhibit a write operation or force the device outputs to a deselected state when not writing. The write enable input 24 when active, allows a write operation to occur on each rising clock edge. The scan enable input 26 is used in connection with enabling a serial scan diagnostics mode. Timing for the memory device 10 is provided by a clock input (CK) 28 and its complement signal $\overline{\text{(CK)}}$ 29.

Two types of output are provided from memory chip 10 including nine bits 31 from a read operation and a parity error output 32.

The memory device 10 includes clocked row and column decoders and sense amps 34, 36 which are connected to the memory array 12 and operate in a well-known manner. Timing and control logic 38 receives control and clock signals 20 through 30 and provides clock and control signals to control operation of the device, in a well-known manner.

The internal clock line 70 receives a clock signal from the selectable clock multiplier circuit 72. The input clock signal 28 has a first frequency. The multiplier circuit 72 receives a test mode signal 74. When the test mode 74 is in a first state, the selectable multiplier circuit 72 passes the unmultiplied clock signal 28 to the internal clock line 70. When the test mode signal 74 is in a second state, the selectable multiplier circuit 72 supplies a multiplied clock signal to the internal clock line 70. The internal clock line 70, whether bearing the original clock signal or a multiplied clock signal, is applied to the components of the integrated circuits 8 in normal fashion and is therefore conveyed to the input register 14 and timing and control logic 42 as depicted in FIG. 1.

The present invention can be included in an integrated circuit 8 which is used, for example, in a computer or in other applications using a memory chip 8 as is well-known in the art. The present invention is particularly useful, however, when the integrated circuit chip 8 is being tested using a test apparatus 76. When the integrated circuit 8 is being tested by the test apparatus 76, the inputs to the circuit 15a through 28 and 74 come not from, e.g., the bus system but from the test apparatus 76. Similarly, data arriving from the output register 62 such as data read from the memory 31 and parity error signals 32, rather than being provided exclusively to a data bus, are provided to the test apparatus 76 for evaluation. Any of a number of known test apparatus 76 can be used. One example of such a test apparatus is Sentry model 5588, produced by Shlumberge Test Systems.

Figure 2:
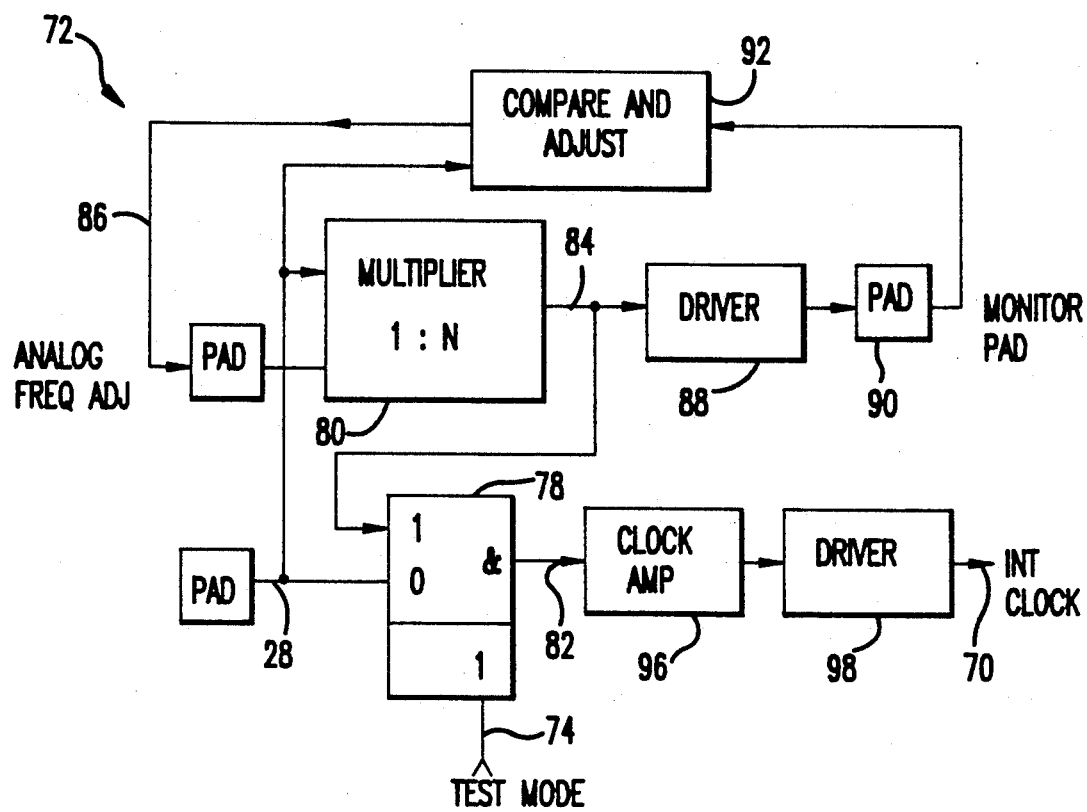
FIG. 2 is a schematic block diagram of the selectable clock multiplier circuitry according to the present invention.

FIG. 2 is a block diagram of the selectable multiplier device 72. The selectable multiplier circuitry 72 receives at least two inputs: the input clock signal 28 and the test mode signal 74. The selectable multiplier circuit 72 outputs at least a clock signal to the internal clock line 70. The selectable multiplier circuit 72 includes a multiplexer 78 and a clock multiplier 80. The multiplexer 78 receives two inputs and, depending upon the state of the test mode signal 74, outputs one of these two inputs to its output line 82. The two inputs received by the multiplexer 78 are the input clock signal 28 and a multiplied clock signal arriving from the output line 84 of the multiplier 80. Thus, when the test mode signal 74 is in a first state, the multiplexer 78 provides the input clock signal 28 to the multiplexer output line 82. When the test mode 74 is in a second state, the multiplexer 78 provides the multiplied clock signal from the multiplier output line 84 to the multiplexer output line 82.

The multiplier 80 has two inputs: the input clock signal 28 and an analog frequency adjustment signal 86. As described more fully below, the multiplier 80 outputs the multiplied clock signal onto an output line 84. The output from the multiplier 84 is supplied to the multiplexer 78 and also, via a driver 88, to a monitor pad 90. The monitor pad is made available so that the multiplied frequency which is output by the multiplier 80 can be monitored. Preferably, the monitored signal is used to provide a feedback to control the frequency of the multiplied clock signal. In the embodiment depicted in FIG. 2, the output from the monitor pad 90 is provided to a compare and adjust circuit 92. A number of techniques are known for providing an analog signal which is useful for controlling the pulse-width as desired. According to one technique, a timing device is used to determine, over a plurality of input clock signals, the ratio of the amount of time the multiplex clock signal is in the high state to the amount of time it is in the low state. Ideally, the multiplied clock signal 84 will be in the high state and the low state an equal amount of time. Thus, if the multiplied clock signal is in a high state less than 50% of the time, the analog signal 86 will be adjusted to increase the pulse-width, and thereby increase the amount of time the multiplied clock signal 84 is in the high state. Similarly, if the multiplied clock signal 84 is in the high state more than 50% of the time, the analog signal 86 is adjusted to decrease the pulse-width of the one-shots.

The compare and adjust circuit 92 outputs an analog signal 86 which is effective to adjust the frequency of the signal output by the multiplier 80 as described below.

The signal output from the multiplexer 82 is preferably provided to a clock amplifier 96 and a driver 98 to provide the logic gain to drive high capacitance internal wires such as internal clock line 70 before the clock signal is placed on the internal clock line 70.

Figure 3:
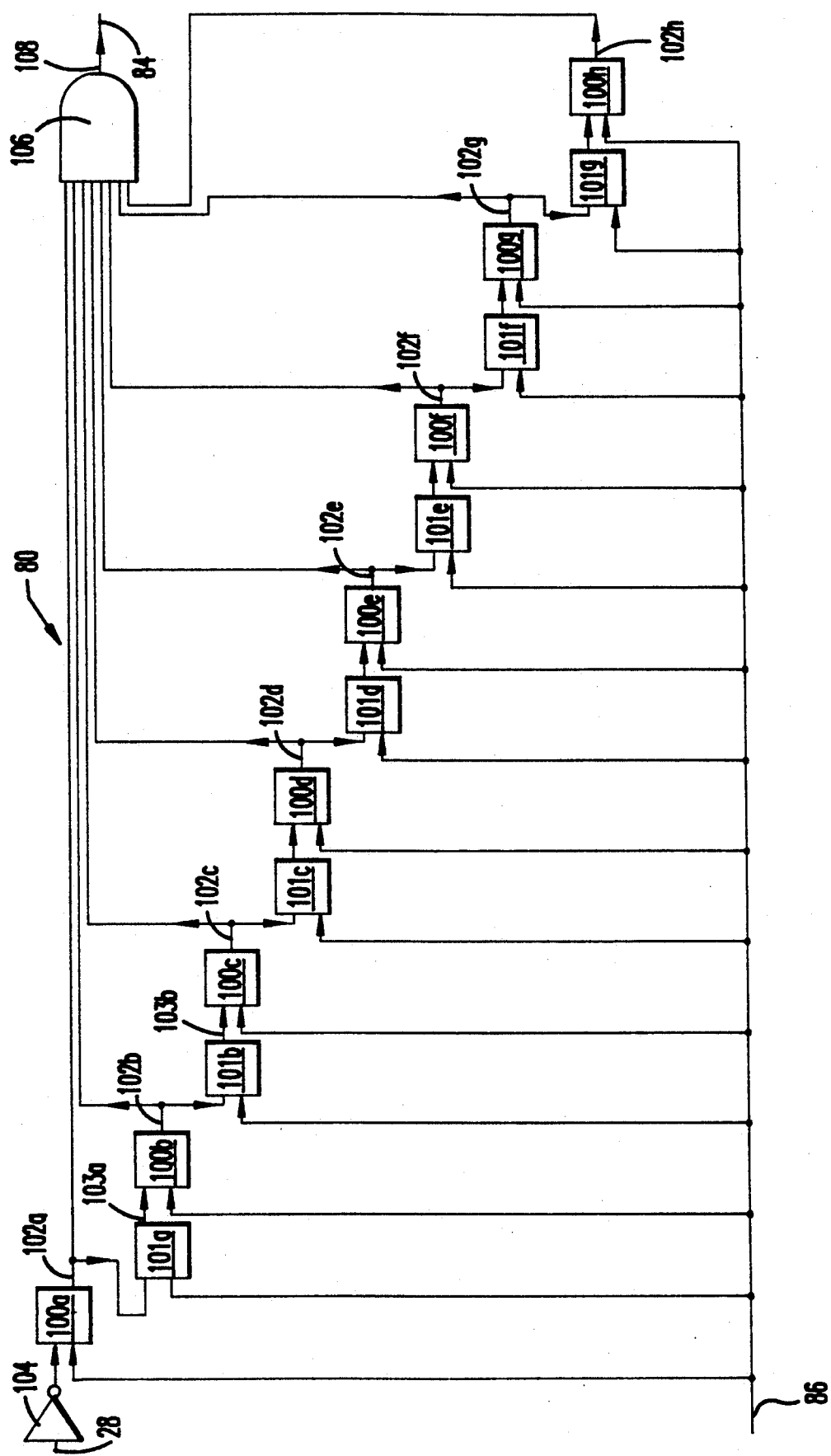
FIG. 3 is a block diagram of one embodiment of a multiplier according to the present invention.

FIG. 3 depicts a multiplier provided according to the present invention. In the preferred embodiment, the mutliplier 80 includes a plurality of one-shot devices, which are preferably mono-stable, multivibrators 100a–100h, 101a–101g. One-shots 100a–101h, 101a–101g have internal circuitry which is well-known in the art. In the embodiment depicted in FIG. 3 eight one-shots 100a–100h provide output to a gate 106 and are effective to multiply the input clock signal by eight, such as is useful to receive an input clock signal of about 25 MHz. and output a multiplied clock signal of about 200 MHz. As will be apparent to those skilled in the art, more or fewer one-shots can be used to achieve other degrees of multiplication.

Each one-shot 100a–100h provides an output 102a–102h which is in one of two states: a high voltage state and a low voltage state. In the preferred embodiment, each one-shot 100a–100h normally provides a low output. Upon receiving an input signal the one-shot output changes state for an amount of time before returning to the low state. Thus, the output of the one-shot will be a pulse of high voltage which has a duration or pulse-width. The output from each of the first series of one-shots 100a–100h is provided to the gate 106 and, except for the last one shot-100h, to one of a second series of one shots 101a–101g. The second series of one shots provide a delay of one pulse-width before providing an output to the next in the first series of one-shots 100b–100h. The one-shots 100a–100h, 101a–101g are configured such that each is triggered by the previous one-shot's return to the low voltage state. The first one-shot 100a receives a signal based on the input clock signal 28. The input clock signal 28 is inverted by an inverter 104 so that the rising clock edge of the input clock signal 28 becomes a falling clock edge. The falling clock edge triggers the first one-shot 100a which causes the output 102a to rise to a high voltage level where it is maintained for a pulse-width. When the high-voltage level of the output 102a drops to the low voltage level (after the period of time equal to the pulse-width) the drop in output voltage 102a triggers the first of the second series of one-shots 101a. In response, the output 103a will rise to a high level, be maintained at the high level for a pulse-width and drop to the low level. When the voltage level of the output 103a drops to the low voltage level (after the period of time equal to the pulse-width) the drop in the output voltage 103a triggers the next one-shot 100b. The output 102b from the second one-shot 100b will rise to a high level, be maintained at the high level for a pulse-width and drop to the low level, in turn triggering the second in the second series of one-shots 101b. The second in the second series of one-shots 101b outputs a high voltage signal 103b which, after a delay of one pulse-width, drops to a low level triggering the next in the first series of one-shots 100c. Thus, the series of one-shots, 100a-100h will produce a cascade of eight falling voltage levels spaced apart by a pulse-width. Because the one-shots 100a-100h are substantially identical, the pulse-widths will be substantially identical. The outputs from the one-shots 100a-100h are provided to the gate 106 which outputs a signal 108 which is a combination of the outputs 102a-102h from the individual one-shots 100a-100h. The output signal 108 will thus contain a series of eight evenly spaced pulses in response to a single rising clock edge of the input signal 28.

Although the pulses in the output 108 from the gate 106 will be evenly spaced, it is possible they will not be spaced by one eighth of the period of the input clock signal 28 as desired. For this reason, the one-shots 100a-100h have an adjustable pulse-width. The pulse-width is adjustable by an analog signal 86 provided as described above. Any one-shot 100a-100h which has an adjustable pulse width can be used. The output from the AND-gate 106 is preferably further treated by a signal conditioning device 110, which may be, for example, another one-shot, so that the output signal 84 will have a substantially square-wave shape.

Figure 4A:
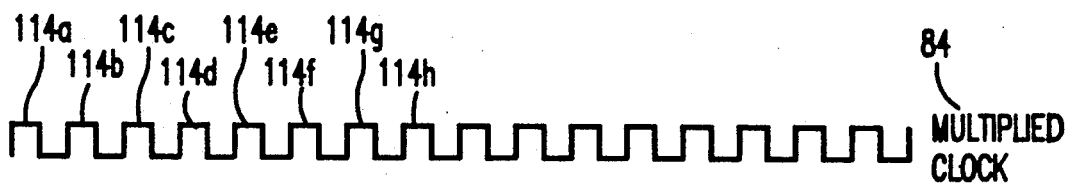
FIGS. 4A and 4B are timing diagrams depicting an input clock and a multiplied clock signal.
Figure 4B:
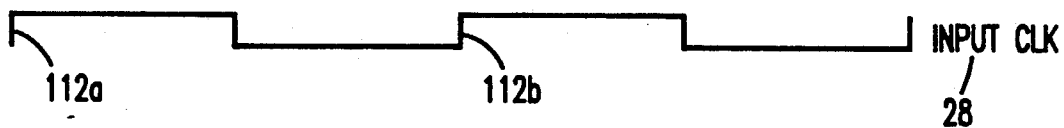

As depicted in FIG. 4, as a result of the multiplier circuit depicted in FIG. 3, for each rising edge 112a, 112b of the input clock signal 28, a series of eight evenly-spaced and evenly-distributed square wave pulses 114a-114h will be output from the multiplier 84 to provide a multiplied clock signal.

As will be apparent from the above description, a number of advantages of the present invention are provided. According to the present invention, an integrated circuit such as a memory chip can be tested at its normal operating frequency using readily available lower-frequency test apparatus without the necessity for providing or attaching external multiplier devices. The clock multiplier circuitry is selectable so that when a first test mode signal is applied to the selectable multiplier circuitry, the multiplied clock signal is placed on the internal clock line and when a second test mode signal is applied to the multiplier circuitry (or when the test mode input is floated or unconnected) the input clock signal is placed on the internal clock line.

A number of variations and modifications to the present invention can also be used. The selectability aspect of the present invention can be used with a multiplier other than the disclosed multiplier which involves a series of one-shots, such as a voltage controlled oscillator. Two or more multipliers could be provided to permit selection among a plurality of multiplication factors. The multiplied clock signal could be multiplied by a factor other than eight. The selectable clock multiplier can be used in connection with circuits other than SRAM memory circuits, including DRAM memory circuits, read only memories, and non-memory circuits. Although the description of the invention has included a description of a preferred embodiment and certain variations and modifications, other variations and modifications will be apparent to those skilled in the art. The invention being defined by the appended claims.

What is claimed is:

1. In an integrated circuit having at least a first internal clock signal line, apparatus for selectably translating a clock signal to a higher-frequency clock signal, comprising:

input means for receiving a first clock signal;

multiplier means for receiving said clock signal from said input means and outputting a second clock signal having a higher frequency than said first clock signal;

means for adjusting the frequency of said second clock signal; and multiplexer means for selectably placing one of said first clock signal and said second clock signal on said internal clock signal line.

2. Apparatus, as claimed in claim 1, wherein said multiplier means comprises a plurality of one-shots.

3. Apparatus, as claimed in claim 2, wherein said means for adjusting frequency includes means, in each of said plurality of one-shots, for receiving an analogue signal for adjusting the pulse-width of the one-shot.

4. Apparatus, as claimed in claim 3, wherein said analog signal is based on said second clock signal to provide a feedback control.

5. Apparatus, as claimed in claim 1, further comprising means for providing said second clock signal to a pad to permit monitoring of the frequency of said second signal.

6. Apparatus, as claimed in claim 1, wherein said input means, said multiplier means and said multiplexer means are provided on a single integrated circuit chip.

7. Apparatus, as claimed in claim 6, wherein said integrated circuit chip is a memory chip including means for receiving data from a data input line and for storing said data in a plurality of addressable memory locations.

8. Apparatus, as claimed in claim 1, wherein said integrated circuit includes means for receiving input from test apparatus and wherein said first clock signal is provided by said test apparatus.

9. Apparatus, as claimed in claim 1, wherein said integrated circuit has a normal operating frequency and wherein said first clock signal is less than said normal operating frequency.

10. Apparatus, as claimed in claim 1, wherein said integrated circuit has a normal operating frequency and wherein said second clock signal is substantially equal to said normal operating frequency.

11. Apparatus, as claimed in claim 3, wherein said analog signal indicates the ratio of the amount of time said second clock signal is in a high state to the amount of time said second clock siganl is in a low state.

12. In an integrated circuit having at least a first internal clock signal line, said integrated circuit having a normal operating frequency, apparatus for selectably translating a clock signal to a higher-frequency clock signal, comprising:

input means for receiving a first clock signal, said first clock signal having a frequency less than said normal operating frequency;

multiplier means for receiving said first clock signal from said input means and outputting a second clock signal having a frequency substantially equal to said normal clock frequency, said multiplier means comprising a plurality of series-connected one-shots, each of said plurality of one-shots including means for receiving an analogue signal for adjusting the pulse-width of the one-shot;

means for monitoring the frequency of said second clock signal and providing said analogue signal; and multiplexer means for selectably placing one of said first clock signal and said second clock signal on said internal clock signal line;

said input means, said multiplier means and said multiplexer means being provided on a single integrated circuit chip wherein said integrated circuit chip is a memory chip including means for storing data in a plurality of addressable memory locations.

13. In an integrated circuit having at least a first internal clock signal line, a method for translating a clock signal to a higher-frequency clock signal, comprising:

receiving a first clock signal;

multiplying said received clock signal and outputting a second clock signal having a higher frequency than said first clock signal;

adjusting the frequency of said second clock signal; and selecting, in response to a selection signal, one of said first clock signal and said second clock signal for placing on said internal clock signal line.

14. A method, as claimed in claim 12, wherein said step of multiplying said received clock signal comprises:

providing a plurality of one-shots;

providing said received clock signal to at least a first of said plurality of one-shots; and providing the outputs of at least some of said plurality of one-shots to a logic gate.

15. A method, as claimed in claim 14, further comprising:

adjusting the pulse-width of said plurality of one-shots to adjust the frequency of said second clock signal.

16. A method, as claimed in claim 12, further comprising:

receiving said first clock signal from test apparatus.

17. A method, as claimed in claim 12, wherein said integrated circuit has a normal operating frequency and wherein said second clock signal is substantially equal to said normal operating frequency.

18. In an integrated circuit having at least a first internal clock signal line, apparatus for selectively translating a clock signal to a higher-frequency clock signal, comprising:

input means for receiving a first clock signal;

multiplier means for receiving said first clock signal from said input means and outputting a second clock signal having a higher frequency than said first clock signal;

a multiplexer having at least a first, second, and third input signal and an output signal, said first input signal being said first clock signal, said second input signal being said second clock signal, said third input signal being a control signal for said multiplexer, said output signal being said first input signal when said control signal is in a first state and said output signal being said second input signal when said control signal is in a second state.

* * * * *